United States Patent
Shimizu et al.

(10) Patent No.: US 6,525,619 B1
(45) Date of Patent: Feb. 25, 2003

(54) CRYSTAL-OSCILLATOR CIRCUIT FOR PREVENTING STOPPING OF OSCILLATION

(75) Inventors: Takeshi Shimizu, Fukushima (JP); Masataka Kumaki, Aomori-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 65 days.

(21) Appl. No.: 09/651,690

(22) Filed: Aug. 30, 2000

(30) Foreign Application Priority Data

Sep. 1, 1999 (JP) .......................................... 11-246854

(51) Int. Cl.$^7$ ................................................ H03B 5/04
(52) U.S. Cl. ................... 331/116 R; 331/109; 331/158; 331/175
(58) Field of Search ............................ 331/116 R, 109, 331/158, 116 FE, 175

(56) References Cited

U.S. PATENT DOCUMENTS 5,025,229 A 6/1991 Hasegawa et al. ........ 331/107 A
5,309,116 A 5/1994 Stone ........................... 331/37
6,271,734 B1 * 8/2001 Satoh ........................... 331/109

OTHER PUBLICATIONS

Koyama et al., "Precise Measurement of Resonance Current and Frequency Characteristics of Quartz Oscillators for Oven–Controlled Crystal Oscillators", Electronics and Communications in Japan, Part 2, vol. 79, No. 4, 1996, pp. 39–45.

* cited by examiner

Primary Examiner—Arnold Kinkead
(74) Attorney, Agent, or Firm—Brinks Hofer Gilson & Lione

(57) ABSTRACT

A crystal-oscillator circuit includes an oscillation transistor having the collector or the base thereof at a ground potential. A first capacitor is connected between the base and the emitter of the oscillation transistor. A second capacitor is connected between the emitter and the collector. A quartz crystal resonator and a third capacitor are connected in series between the base and the collector. The third capacitor is disposed at the ground potential side. An oscillation signal is extracted from a node between the quartz crystal resonator and the capacitor.

16 Claims, 2 Drawing Sheets

CRYSTAL-OSCILLATOR CIRCUIT FOR PREVENTING STOPPING OF OSCILLATION

BACKGROUND OF THE INVENTION

1. Field of the Invention

The present invention relates to crystal-oscillator circuits for phase-locked loop (PLL) circuits for use in image display devices having television tuners and radio frequency (RF) modulators.

2. Description of the Related Art

In image display devices having television tuners and RF modulators, the television tuners and the RF modulators are provided with PLL circuits. Each PLL circuit is provided with a crystal-oscillator circuit employed as a reference oscillation circuit. FIG. 3 shows the structure of a conventional crystal-oscillator circuit. The crystal-oscillator circuit includes a first crystal-oscillator circuit 20 employed for a PLL circuit of a television tuner and a second crystal-oscillator circuit 30 employed for a PLL circuit of an RF modulator. The first crystal-oscillator circuit 20 and the second crystal-oscillator circuit 30 share a single quartz crystal resonator 40.

The first crystal-oscillator circuit 20 is formed by a first oscillation transistor 21, the quartz crystal resonator 40, and the like. The second crystal-oscillator circuit 30 is formed by a second oscillation transistor 31, the quartz crystal resonator 40, and the like. In FIG. 3, DC bias circuits for the oscillation transistors 21 and 31 are omitted.

In the first crystal-oscillator circuit 20, the collector of the first oscillation transistor 21 is grounded at a high frequency by a ground capacitor 22. A feedback capacitor 23 extends between the emitter and the ground, and a feedback capacitor 24 extends between the base and the emitter. A Clapp capacitor 41 is provided in series with the quartz crystal resonator 40 between the base and the ground. The Clapp capacitor 41 is connected to the base, whereas the quartz crystal resonator 40 is connected to the ground. An oscillation signal is output from the emitter of the first oscillation transistor 21 and is input to the PLL circuit of the television tuner (not shown).

In contrast, in the second crystal-oscillator circuit 30, the collector of the second oscillation transistor 31 is grounded at a high frequency by a ground capacitor 32. A feedback capacitor 33 extends between the emitter and the ground, and a feedback capacitor 34 extends between the base and the emitter. A Clapp capacitor 42 is provided in series with the quartz crystal resonator 40 between the base and the ground. The Clapp capacitor 42 is connected to the base, whereas the quartz crystal resonator 40 is connected to the ground. An oscillation signal is output from the emitter of the second oscillation transistor 31 and is input to the PLL circuit of the RF modulator (not shown).

In the above arrangement, the single quartz crystal resonator 40 is shared by the two crystal-oscillator circuits 20 and 30. With regard to one crystal-oscillator circuit, it seems that the oscillation transistor of the other crystal-oscillator circuit is connected in parallel with the quartz crystal resonator 40. Hence, the former crystal-oscillator circuit has a significantly small apparent Q-factor of the quartz crystal resonator 40, failing to ensure a sufficient load resistance required for oscillation. This may cause oscillation to stop.

SUMMARY OF THE INVENTION

Accordingly, it is an object of the present invention to provide a crystal-oscillator circuit that prevents oscillation stoppage due to a reduction in the apparent Q-factor of a quartz crystal resonator when an oscillation signal is extracted.

To this end, a crystal-oscillator circuit according to the present invention includes an oscillation transistor having the collector or the base thereof at a ground potential. A first capacitor is connected between the base and the emitter of the oscillation transistor. A second capacitor is connected between the emitter and the collector. A quartz crystal resonator and a capacitor are connected in series between the base and the collector. An oscillation signal is extracted from a node between the quartz crystal resonator and the capacitor.

The collector of the oscillation transistor may be grounded. The quartz crystal resonator may be disposed at the base side. The capacitor may be disposed at the ground potential side.

According to a crystal-oscillator of the present invention, no other circuit is connected in parallel with the crystal-oscillator circuit. Hence, the apparent Q-factor of the crystal-oscillator is not reduced, preventing stopping of oscillation. Also, the crystal-oscillator circuit of the present invention forms a Colpitts oscillator circuit that prevents the stopping of oscillation.

DESCRIPTION OF THE PREFERRED EMBODIMENTS

Figure 1:
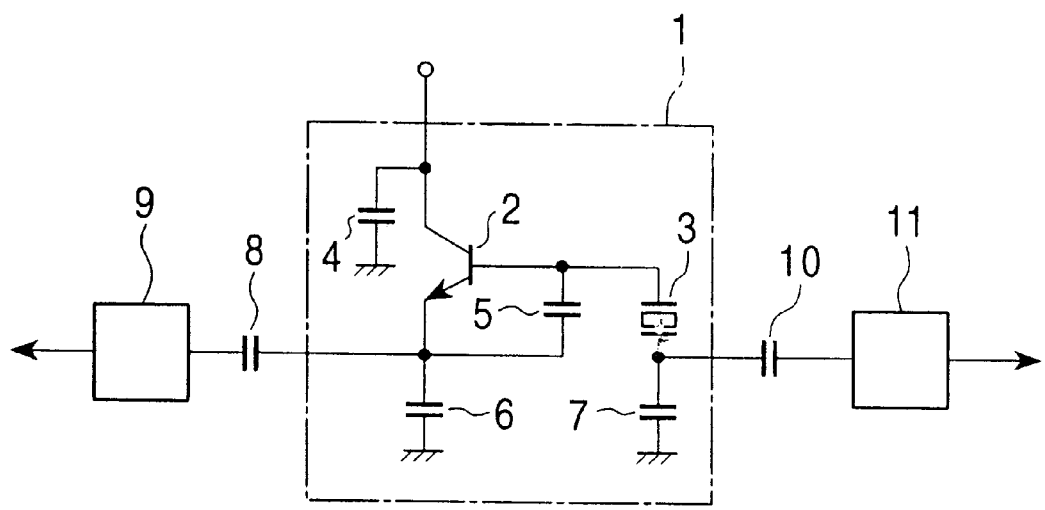
FIG. 1 is a circuit diagram of the structure of a crystal-oscillator circuit according to an embodiment of the present invention.

FIG. 1 shows a crystal-oscillator circuit 1 according to an embodiment of the present invention. The crystal-oscillator circuit 1 is built in, for example, an image display device having a television tuner and an RF modulator. The crystal-oscillator circuit 1 outputs a reference oscillation signal to a PLL circuit (not shown) of the television tuner and a PLL circuit (not shown) of the RF modulator. Referring to FIG. 1, the crystal-oscillator circuit 1 is formed by an oscillation transistor 2, a quartz crystal resonator 3, and the like. The collector of the oscillation transistor 2 is connected to ground by a ground capacitor 4. A first capacitor 5 extends between the base and the emitter. The emitter is connected to the ground by a second capacitor 6. As a result, the second capacitor 6 is connected between the emitter and the collector.

A Clapp capacitor 7 is connected in series with the quartz crystal resonator 3 between the base and the ground. The quartz crystal resonator 3 is connected to the base, whereas the Clapp capacitor 7 is connected to the ground at a ground potential. Therefore, the crystal-oscillator circuit 1 is formed by a common collector circuit. The series connection of the quartz crystal resonator 3 and the Clapp capacitor 7 is connected between the base and the collector. In FIG. 1, a DC bias circuit for the oscillation transistor 2 is omitted.

An oscillation signal arising at the emitter of the oscillation transistor 2 is input via a coupling capacitor 8 to a first buffer circuit 9. The oscillation signal is amplified by the first buffer circuit 9, and is input to the PLL circuit (not shown)

of the television tuner. An oscillation signal arising at a node between the quartz crystal resonator 3 and the Clapp capacitor 7 is input via a coupling capacitor 10 to a second buffer circuit 11. The oscillation signal is amplified by the second buffer circuit 11, and is input to the PLL circuit (not shown) of the RF modulator.

With this arrangement, the second buffer circuit 11 side is connected in parallel with the Clapp capacitor 7. Hence, the apparent Q-factor of the quartz crystal resonator 3 is not reduced, thus preventing the oscillation from stopping.

Figure 2:
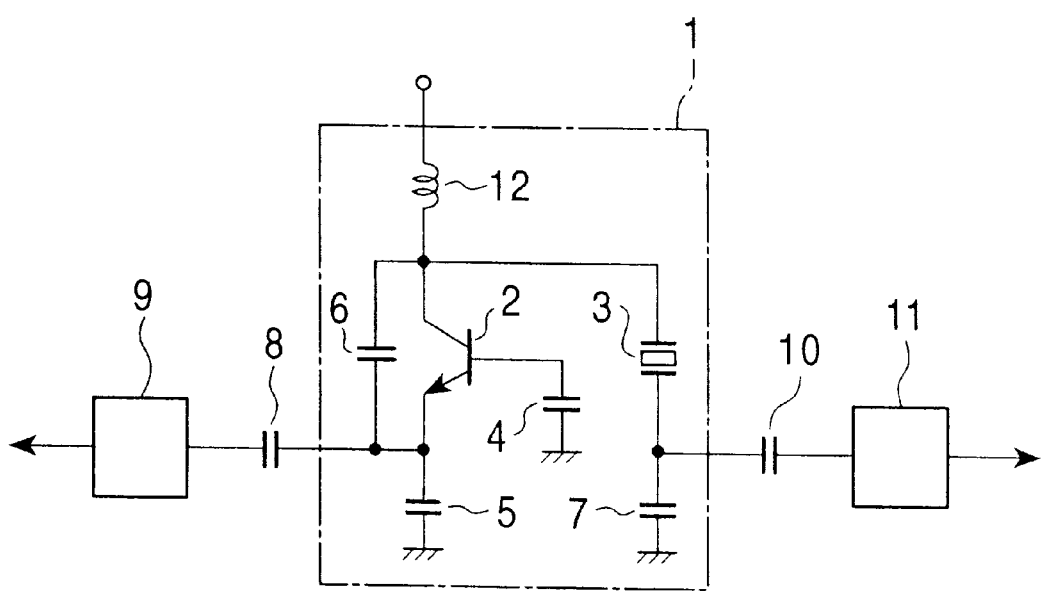
FIG. 2 is a circuit diagram of the structure of a crystal-oscillator circuit according to another embodiment of the present invention.
Figure 3:
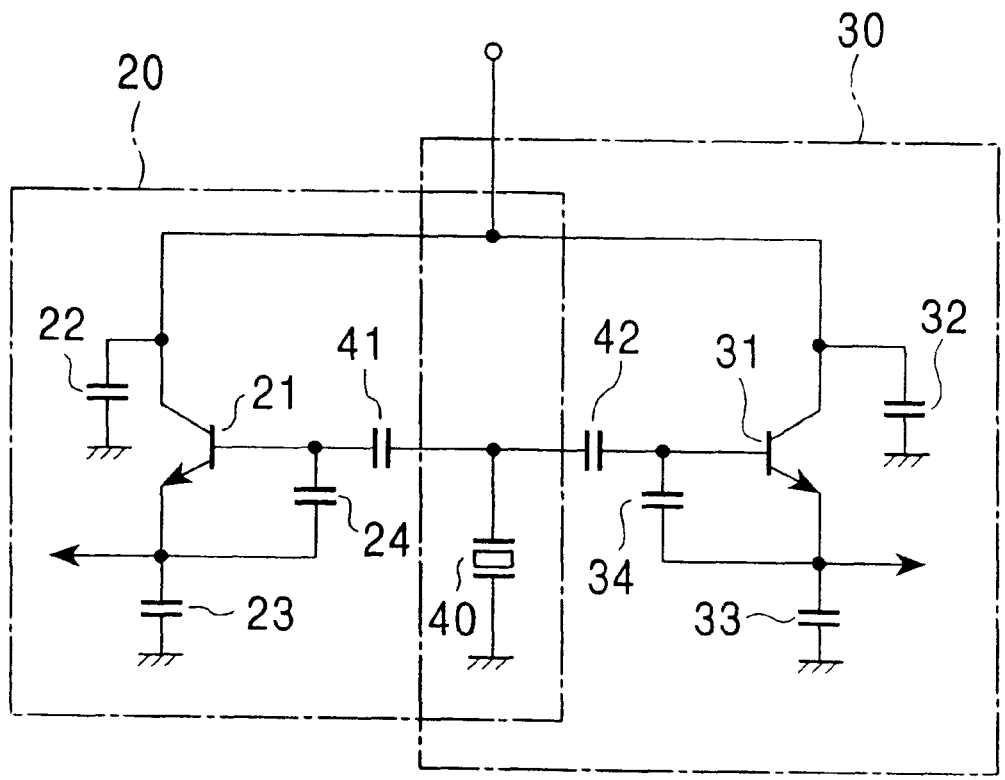
FIG. 3 is a circuit diagram of a conventional crystal-oscillator circuit.

FIG. 2 shows a quartz crystal oscillator circuit 1 according to another embodiment of the present invention. In this embodiment, the quartz crystal resonator is formed by a common base circuit. The base of the oscillation transistor 2 is connected to the ground by the ground capacitor 4. Hence, the base is at a ground potential. The emitter is connected to the ground by the first capacitor 5. The second capacitor 6 extends between the emitter and the collector. As a result, the first capacitor 5 is connected between the emitter and the base.

The Clapp capacitor 7 is connected in series with the quartz crystal resonator 3 between the collector and the ground. The quartz crystal resonator 3 is connected to the collector, whereas the Clapp capacitor 7 is connected to the ground. Hence, the crystal-oscillator circuit 1 is formed by a common base circuit. The series connection of the quartz crystal resonator 3 and the Clapp capacitor 7 is connected between the base and the collector. Note that, although the Clapp capacitor 7 is illustrated in FIGS. 1 and 2, other circuit element(s) may be used to provide to prevent the quartz crystal resonator 3 from stopping oscillating (e.g. by providing the necessary impedance). For example, inductors and/or other frequency-variable elements/combination of circuit elements may be selected to provide the necessary impedance for the desired oscillation frequency of the particular quartz crystal resonator used, to prevent a decrease in the apparent Q-factor of the quartz crystal resonator and thereby maintain oscillation of the quartz crystal resonator. In FIG. 2, a DC bias current for the oscillation transistor 2 is omitted. A power supply voltage is applied to the collector through a choke inductor 12.

Referring to FIG. 2, as in FIG. 1, an oscillation signal arising at the emitter of the oscillation transistor 2 is input via the coupling capacitor 8 to the first buffer circuit 9. The oscillation signal is amplified by the first buffer circuit 9, and is input to the PLL circuit (not shown) of the television tuner. An oscillation signal arising at the node between the quartz crystal resonator 3 and the Clapp circuit 7 is input via the coupling capacitor 10 to the second buffer circuit 11. The oscillation signal is amplified by the second buffer circuit 11, and is input to the PLL circuit (not shown) of the RF modulator.

With this arrangement, the second buffer circuit 11 side is connected in parallel with the Clapp capacitor 7. Therefore, the apparent Q-factor of the quartz crystal resonator 3 is not reduced, thus preventing the oscillation from stopping.

What is claimed is:

1. A crystal-oscillator circuit comprising:
   an oscillation transistor having one of a collector and a base thereof at a ground potential;
   a first capacitor connected between the base and an emitter of said oscillation transistor;
   a second capacitor connected between the emitter and the collector; and
   a quartz-crystal resonator and at least one circuit element connected between the base and the collector;
   wherein an oscillation signal is extracted from a node between said quartz crystal resonator and said at least one circuit element, said at least one circuit element maintaining oscillation of the quartz crystal resonator.

2. A crystal-oscillator circuit according to claim 1, said at least one circuit element including a third capacitor, said third capacitor connected in series with the quartz-crystal resonator and disposed on a ground potential side of the quartz-crystal resonator, the third capacitor selected to prevent decrease in an apparent Q-factor of the crystal resonator.

3. A crystal-oscillator circuit according to claim 2, wherein the collector of said oscillation transistor is at the ground potential and said quartz crystal resonator is disposed at the base side of said oscillation transistor.

4. A crystal-oscillator circuit comprising:
   an oscillation transistor having an emitter, a collector and a base;
   a first capacitor connected between the base and emitter of said oscillation transistor;
   a second capacitor connected between the collector and ground;
   a third capacitor connected between the emitter and ground; and
   a quartz-crystal resonator and a fourth capacitor connected in series between the base and ground, said fourth capacitor being disposed at a ground potential side;
   wherein an oscillation signal is extracted from a node between said quartz crystal resonator and said fourth capacitor, thereby preventing decrease in an apparent Q-factor of the crystal resonator and maintaining oscillation of the quartz crystal resonator.

5. A crystal-oscillator circuit comprising:
   an oscillation transistor having an emitter, a collector and a base;
   a first capacitor connected between the collector and emitter of said oscillation transistor;
   a first grounding capacitor connected between the base and ground;
   a second grounding capacitor connected between the emitter and ground; and
   a quartz-crystal resonator and a second capacitor connected in series between the collector and ground, said second capacitor being disposed at the ground potential side;
   wherein an oscillation signal is extracted from a node between said quartz crystal resonator and said second capacitor, thereby preventing decrease in an apparent Q-factor of the crystal resonator and maintaining oscillation of the quartz crystal resonator.

6. A crystal-oscillator circuit according to claim 5, further comprising a choke inductor connected between the collector and a power supply voltage.

7. A method for maintaining oscillation in a crystal oscillation circuit comprising:
   providing an oscillation signal from a quartz-crystal resonator;
   grounding one of a collector and a base of an oscillation transistor;
   providing feedback between the base and an emitter of said oscillation transistor;
   providing feedback between the collector and the emitter of said oscillation transistor;

connecting said quartz crystal resonator and at least one circuit element between the base and the collector of said oscillation transistor;

preventing decrease in an apparent Q-factor of the crystal resonator and thereby maintaining oscillation of the quartz crystal resonator by providing a load in series with said quartz crystal resonator.

8. The method according to claim 7, further comprising extracting the oscillation signal from a node between said quartz crystal resonator and said at least one circuit element.

9. The method according to claim 7, further comprising connecting said at least one circuit element in series with said quartz crystal resonator.

10. The method according to claim 9, further comprising selecting at least a capacitor as said at least one circuit element and connecting said capacitor on a ground potential side of the quartz-crystal resonator and said quartz crystal resonator on the base side of said oscillation transistor.

11. The method according to claim 9, further comprising grounding the collector of said oscillation transistor.

12. A crystal-oscillator circuit comprising:

an oscillation transistor having one of a collector and a base thereof at a ground potential;

a first capacitor connected between the base and an emitter of said oscillation transistor;

a second capacitor connected between the emitter and the collector; and a quartz-crystal resonator and at least one circuit element connected between the base and the collector;

wherein a first oscillation signal is extracted from a node between said quartz crystal resonator and said at least one circuit element, said at least one circuit element maintaining oscillation of the quartz crystal resonator, and wherein a second oscillation signal is extracted from a second node between said emitter and said second capacitor.

13. A crystal-oscillator circuit according to claim 2, wherein the collector of said oscillation transistor is at the ground potential and said quartz crystal resonator is disposed at the base side of said oscillation transistor.

14. A crystal-oscillator circuit comprising:

an oscillation transistor having an emitter, a collector and a base;

a first capacitor connected between the collector and ground;

a second capacitor connected between the emitter and ground; and a quartz-crystal resonator and a third capacitor connected in series between the base and ground, said third capacitor being disposed at a ground potential side;

wherein a first oscillation signal is extracted from a node between said quartz crystal resonator and said third capacitor, thereby preventing decrease in a apparent Q-factor of the crystal resonator and maintaining oscillation of the crystal resonator, and wherein a second oscillation signal is extracted from a second node between said emitter and said second capacitor.

15. A crystal-oscillator circuit comprising:

an oscillation transistor having an emitter, a collector and a base;

a first capacitor connected between the collector and emitter of said oscillation transistor;

a first grounding capacitor connected between the base and ground;

a second grounding capacitor connected between the emitter and ground; and a quartz-crystal resonator and a second capacitor connected in series between the collector and ground, said second capacitor being disposed at the ground potential side;

wherein a first oscillation signal is extracted from a node between said quartz crystal resonator and said second capacitor, thereby preventing decrease in an apparent Q-factor of the crystal resonator and maintaining oscillation of the quartz crystal resonator, and wherein a second oscillation signal is extracted from a node between said emitter and said first capacitor.

16. A method for maintaining oscillation in a crystal oscillation circuit comprising:

providing a plurality of oscillation signals from a quartz-crystal oscillation circuit comprising:

grounding one of a collector and a base of an oscillation transistor;

providing feedback between the base and an emitter of said oscillation transistor;

providing feedback between the collector and the emitter of said oscillation transistor;

connecting said quartz crystal resonator and at least one circuit element between the base and the collector of said oscillation transistor;

preventing decreasing in an apparent Q-factor of the crystal resonator and thereby maintaining oscillation of the quartz crystal resonator by providing a load in series with said quartz crystal resonator.

* * * * *

UNITED STATES PATENT AND TRADEMARK OFFICE
CERTIFICATE OF CORRECTION

PATENT NO.    : 6,525,619 B1
DATED         : February 25, 2003
INVENTOR(S)   : Takeshi Shimizu and Masataka Kumaki It is certified that error appears in the above-identified patent and that said Letters Patent is hereby corrected as shown below:

<u>Column 3,</u>
Line 66, delete "quartz-crystal" and substitute -- quartz crystal -- in its place.

<u>Column 4,</u>
Lines 7, 9, 27 and 46, delete "quartz-crystal" and substitute -- quartz crystal -- in its place.

<u>Column 5,</u>
Lines 18 and 29, delete "quartz-crystal" and substitute -- quartz crystal -- in its place.

<u>Column 6,</u>
Lines 1, 22 and 34-35, delete "quartz-crystal" and substitute -- quartz crystal -- in its place.

Signed and Sealed this

Second Day of September, 2003

JAMES E. ROGAN
*Director of the United States Patent and Trademark Office*